US006947712B2

United States Patent
Sun et al.

(10) Patent No.: US 6,947,712 B2
(45) Date of Patent: Sep. 20, 2005

(54) GROUP DELAY PRECOMPENSATOR FOR BROADBAND RADIO FREQUENCY TRANSMITTER AND METHOD OF OPERATING THE SAME

(75) Inventors: Yanling Sun, de Meern (NL); Erik B. Busking, The Hague (NL)

(73) Assignee: Agere Systems Inc., Allentown, PA (US)

( * ) Notice: Subject to any disclaimer, the term of this patent is extended or adjusted under 35 U.S.C. 154(b) by 444 days.

(21) Appl. No.: 10/159,651

(22) Filed: May 31, 2002

(65) Prior Publication Data

US 2003/0109222 A1 Jun. 12, 2003

Related U.S. Application Data

(60) Provisional application No. 60/341,741, filed on Dec. 12, 2001.

(51) Int. Cl.[7] .............................. H04B 1/04; H04Q 11/12
(52) U.S. Cl. ................. 455/114.3; 455/63.1; 455/67.13; 455/127.2; 330/149; 330/278; 375/297
(58) Field of Search .............................. 455/63.1, 67.11, 455/67.13, 67.16, 114.2, 114.3, 115.1, 126, 127.1, 127.2, 127.3; 330/129, 136, 149, 278, 285; 375/295, 296, 297

(56) References Cited

U.S. PATENT DOCUMENTS 5,420,536 A * 5/1995 Faulkner et al. ............ 330/149
5,894,496 A * 4/1999 Jones ......................... 455/126
6,275,685 B1 * 8/2001 Wessel et al. ................ 455/126
6,396,345 B2 * 5/2002 Dolman ...................... 330/149
6,449,465 B1 * 9/2002 Gailus et al. ................ 455/126
6,639,950 B1 * 10/2003 Lagerblom et al. .......... 375/297

OTHER PUBLICATIONS

Himmelstoss et al.; Compensated Class–D Amplifier as High Quality AC–Voltage Source; IEEE 1999 International Conference on Power Electronics and Drive Systems, PEDS '99, Jul. 1999; pp 116–120; Hong Kong.

Grant et al.; A DSP Controlled Adaptive Feedforward Amplifier Linearizer; School of Engineering Science; pp 788–792; 1996.

* cited by examiner

Primary Examiner—Quochien B. Vuong

(57) ABSTRACT

The present invention provides, for use in a radio frequency (RF) transmitter that employs a power amplifier to transmit broadband signals, the power amplifier introducing amplitude and phase distortion, a group delay precompensator circuit. In one embodiment, the group delay precompensator circuit includes: (1) a Cartesian feedback loop coupled between an output of the power amplifier and an input of the RF transmitter; and (2) a group delay compensation block, located in the Cartesian feedback loop, that introduces an opposing phase characteristic into the Cartesian feedback loop and thereby precompensates for the phase distortion. A method of precompensating a group delay and an RF transmitter incorporating the precompensator or the method are also disclosed.

20 Claims, 4 Drawing Sheets

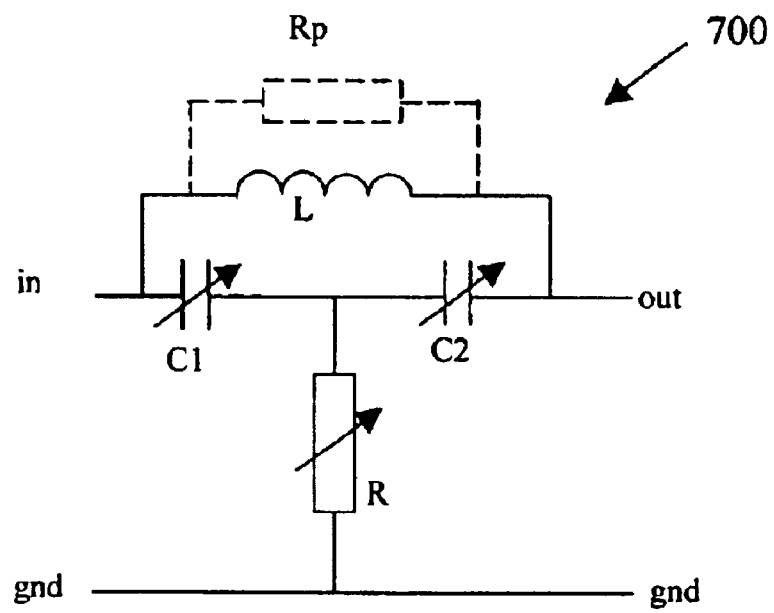
FIGURE 7
FIGURE 8
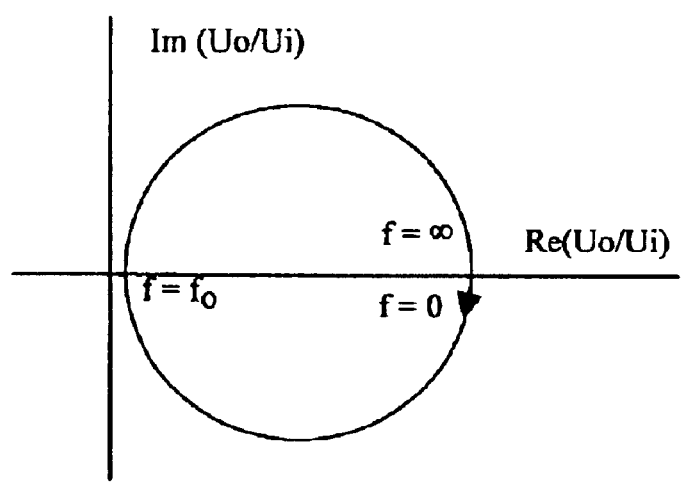

GROUP DELAY PRECOMPENSATOR FOR BROADBAND RADIO FREQUENCY TRANSMITTER AND METHOD OF OPERATING THE SAME

CROSS-REFERENCE TO RELATED APPLICATION

The present application is based on U.S. Provisional Application Ser. No. 60/341,741, filed on Dec. 12, 2001, by Busking, et al., entitled "Cartesian Feedback for Wideband Signal Systems U101-11," commonly assigned herewith and incorporated herein by reference.

TECHNICAL FIELD OF THE INVENTION

The present invention is directed, in general, to radio frequency (RF) transmitters and, more specifically, to a group delay precompensator, for use in an RF transmitter that employs a power amplifier to transmit broadband signals, a method of precompensating a phase, and an RF transmitter incorporating the group delay precompensator or the method.

BACKGROUND OF THE INVENTION

The merge of recent high-speed telecommunications demands wider and wider signal bandwidth for use in these telecommunications systems. However, while attempting to widen the available bandwidth of channels within a given transmission frequency range, for example, in 5 GHz technologies, the combined use of amplitude and phase modulation, such as may be found in orthogonal frequency division multiplex (OFDM) signals, has proven difficult to implement. More specifically, the delivery of improved spectral efficiency of transmitted signals in such so-called linear modulation schemes typically undergoes significant distortion (both phase and amplitude) when the modulated signals are boosted by a power amplifier for transmission to a receiver. Such distortion is especially prevalent in transmitters that implement power efficient, but nonlinear, power amplifiers. As a result, linearization techniques have been developed to produce a desirable trade-off between a transmitter's efficiency and its linearity.

Among the more popular linearization techniques developed to combat this problem is Cartesian feedback linearization. In this type of linearization, a Cartesian feedback is provided after the power amplifier has introduced undesirable distortion into a modulated output signal. The Cartesian feedback is used to compare baseband in-phase and quadrature phase input signals with the distorted baseband in-phase and quadrature phase feedback signals demodulated from the power amplifier. The loop then introduces "predistortion" into the modulated signal prior to the power amplifier so that distortion introduced by the power amplifier is offset to achieve the desired linearization.

Unfortunately, Cartesian feedback linearization has typically only proved successful with narrowband systems. This is this case since broadband systems implement channels having large bandwidth differentials therein. The more delay or phase distortion a power amplifier introduces into the modulated output signal, the more steep the phase versus frequency curve corresponding to a given bandwidth becomes. Thus, if a large bandwidth differential between multiple channels exists, which is typically the case in broadband systems, the Cartesian feedback loop may predistort one channel but not other channels having a large bandwidth differential from the first. As a result, power amplifiers having specifically designed phase characteristics for predetermined bandwidth differentials are usually required to provide the linearization necessary to avoid oscillations at in- and out-of-band frequencies in the circuit loop of a broadband transmitter that may occur at frequencies where large amplitude and phase distortions are present. However, complex design and high manufacturing costs of such specialized power amplifiers have driven manufacturers to seek out a better solution.

Accordingly, what is needed in the art is an RF transmitter for use in broadband communications systems that does not suffer from the deficiencies found in the prior art.

SUMMARY OF THE INVENTION

To address the above-discussed deficiencies of the prior art, the present invention provides, for use in a radio frequency (RF) transmitter that employs a power amplifier to transmit broadband signals, the power amplifier introducing amplitude and phase distortion into the broadband signals, a group delay precompensator. In one embodiment, the group delay precompensator includes a Cartesian feedback loop coupled between an output of the power amplifier and an input of the RF transmitter. In addition, the group delay precompensator includes one or more group delay compensation blocks, located in the Cartesian feedback loop, that introduce an opposing phase characteristic into the Cartesian feedback loop and thereby precompensate for the phase distortion.

In another aspect, the present invention provides a method of precompensating a phase slope versus frequency, or "group delay." In one embodiment, the method includes coupling a Cartesian feedback loop between an output of the power amplifier and an input of the RF transmitter. Also, the method includes introducing an opposing phase characteristic into the Cartesian feedback loop with one or more group delay compensation blocks, located in the Cartesian feedback loop, and thereby precompensating for the phase distortion.

In yet another aspect, the present invention provides a RF transmitter. In one embodiment, the RF transmitter includes an antenna and a power amplifier configured to transmit broadband signals through the antenna, the power amplifier introducing amplitude and phase distortion into the broadband signals. The RF transmitter further includes a Cartesian feedback loop coupled between an output of the power amplifier and an input of the RF transmitter, which includes one or more group delay precompensators. Each group delay precompensator includes a group delay compensation block, located in the Cartesian feedback loop, that introduces an opposing phase characteristic into the Cartesian feedback loop and thereby precompensates for the phase distortion.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which:

FIG. 7 illustrates an alternative embodiment of a band-stop filter for use in the RF portion of a Cartesian feedback loop according to the present invention; and FIG. 8 illustrates a polar plot of output voltage over input voltage for the band-stop filter illustrated in FIG. 7.

DETAILED DESCRIPTION

Figure 1:
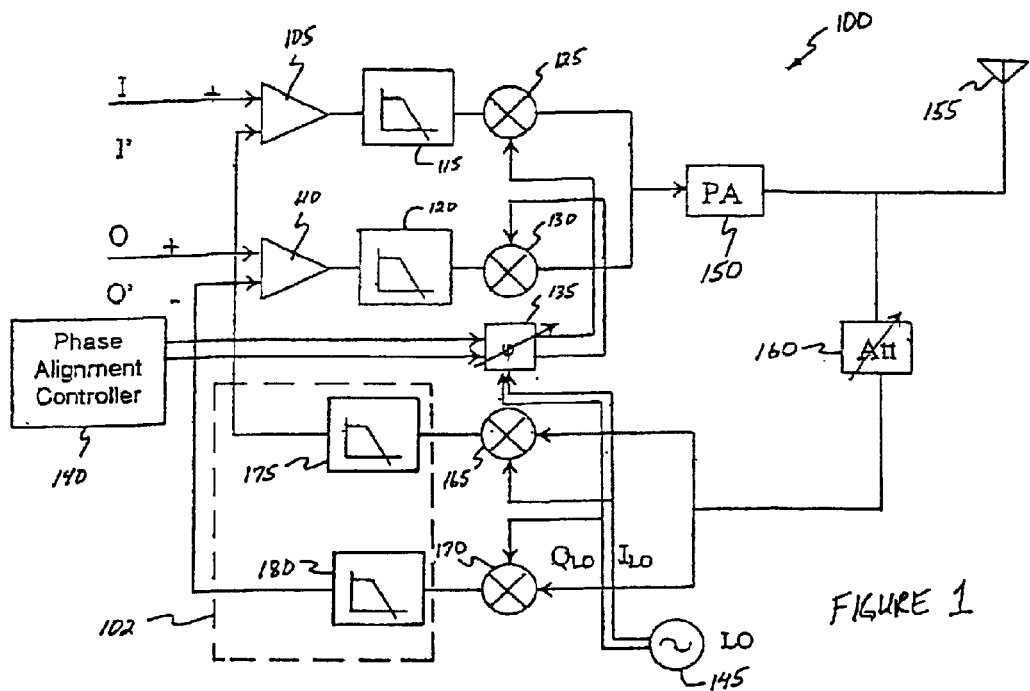
FIG. 1 illustrates an RF transmitter employing a Cartesian feedback loop and having one embodiment of a group delay precompensator constructed according to the principles of the present invention.

Referring initially to FIG. 1, illustrated is an RF transmitter 100 employing a Cartesian feedback loop and having one embodiment of a group delay precompensator constructed according to the principles of the present invention. The RF transmitter 100 includes first and second error comparators 105, 110, that receive in-phase and quadrature phase input signals I, Q from digital-to-analog convertor outputs or other suitable device. The input signals I, Q are compared with feedback in-phase and quadrature phase signals I', Q' (the nature of which will be described in greater detail below) by the first and second error comparators 105, 110.

Signals emanating from the error comparators 105, 110 are provided to first and second modulator loop filters 115, 120. As those skilled in the pertinent art understand, the first and second modulator loop filters 115, 120 substantially remove components of the signals that fall above a predetermined loop bandwidth frequency.

After filtering, the signals are provided to first and second modulating mixers 125, 130. The filtered signals are modulated with a local oscillator signal from a local oscillator 145. The local oscillator signal has been phase shifted by a phase shifter 135 to compensate for the fixed RF delay, as described in greater detail below. A phase alignment controller 140 detects the fixed RF delay in the RF path (primarily from a power amplifier 150) and sends a control signal to the phase shifter 135 to perform a phase adjustment. The modulating mixers 125, 130 multiply the filtered signals with the local oscillator signal and provide the resulting modulated signal to the power amplifier 150. The power amplifier 150 boosts the modulated signal and transmits the signal from the transmitter 100 via an antenna 155.

The boosted output signal is also fed to an attenuator 160 that forms part of a Cartesian feedback loop of the transmitter 100. The attenuator 160 counteracts the gain in the power amplifier 150 so that the signal may be used as a feedback signal to precompensate for any distortion introduced into the output signal by the power amplifier 150. Those skilled in the pertinent art understand that power-efficient power amplifiers are prone to introduce relatively large amounts of frequency-dependent distortion into the signal they amplify. To lessen the extent of such distortion, the attenuated feedback signal is eventually fed into the group delay precompensator having a group delay compensation block 102 constructed according to the principles of the present invention.

However, in the embodiment illustrated in FIG. 1, the feedback signal is first split and fed into first and second demodulating mixers 165, 170 to demodulate the signal. In accordance with conventional practice, the local oscillator 145 provides a reference local oscillator signal so that the demodulating mixers 165, 170 can extract the feedback in-phase and quadrature phase signals I', Q' from the output/feedback signal. The feedback in-phase and quadrature phase signals I', Q' are then provided into the group delay compensation block 102, comprised in this embodiment by first and second demodulator low-pass filters 175, 180. As shown in this embodiment, the group delay compensation block 102 is located in the baseband portion of the feedback loop (i.e., after signal demodulation) for filtering the demodulated feedback signal. In another advantageous embodiment, the group delay compensation block 102 may include the first and second modulator loop filters 115, 120, rather than the demodulator low-pass filters 175, 180. In such an embodiment, the group delay compensation block would be located in the forward path, rather than the feedback path, of the transmitter 100. In other advantageous embodiments, the group delay compensation block may be located in a combination of the feedback path, the forward path and the RF section. Of course, the present invention is not limited to any particular embodiment.

In the illustrated embodiment, the demodulator low-pass filters 175, 180 in the group delay compensation block 102 filter off an unwanted range of the baseband distortion signals at unwanted frequencies. By filtering off unwanted frequencies of the feedback signal, an RF transmitter having a Cartesian feedback loop and incorporating the principles of the present invention may be used to precompensate for phase distortion even in a broadband (or wideband) transmission spectrum. As used herein, the term "broadband" (or "wideband") is defined as having a bandwidth exceeding several MHz. Examples of such broadband transmission schemes may commonly be found in 2.4 GHZ, 5 GHZ, and 10 GHZ technologies, although the present invention is not so limited.

The feedback in-phase and quadrature phase signals I', Q' are then provided to the error comparators 105, 110 and compared to the input in-phase and quadrature phase signals I, Q that are provided to the transmitter 100 from the input device mentioned above. With such an amplified error provided by the comparison, the modulated signal that eventually reaches the power amplifier 150 may be "pre-distorted".

Advantageously, a transmitter 100 constructed according to the present invention allows for Cartesian feedback to be employed with broadband broadcasting. Those who are skilled in the art understand that, before the introduction of the present invention, Cartesian feedback, which is a preferred method employed to linearize distortion in RF transmitters, was typically only available for narrowband RF transmitters. This was due primarily to the inability of conventional Cartesian feedback loops to "precompensate" for phase distortion introduced across broadband frequency ranges, which have large bandwidth differentials between channels therein. Thus, conventional Cartesian feedback loops suffer instability in broadband applications.

However, the group delay compensation block 102 of the present invention provides such precompensation so that Cartesian feedback may be employed with broadband RF transmitters. More specifically, although a large (i.e., "broad") range of bandwidths is typically used in broadband transmissions, the distortion produces much wider frequency range than the original signal bandwidth. Often only a predefined (e.g. 3 or 4 times of original signal bandwidth) portion of this much wider frequency range is needed to correct the distortion. As a result, the low-pass filters 175, 180 may be adjusted such that the comparison between the input in-phase and quadrature phase signals I, Q and the feedback in-phase and quadrature phase signals I', Q' results in a precompensation of the outgoing signal sufficient to correct the distortion introduced by the power amplifier 150, primarily at this "needed" bandwidth range within the applicable broadband spectrum.

Therefore, according to the present invention, the group delay precompensation provided by a broadband transmitter having a Cartesian feedback loop of the present invention results in a transmitted output signal not only having far less distortion, if any, but, more importantly, also far more stabilization than broadband output signals found in the prior art, particularly in the critical bandwidth range. As a result, the group delay compensation block 102 of the present invention, whether provided in the forward path, the feedback path, the RF section of the transmitter, or any combination thereof, allows the benefits of Cartesian feedback to be brought to broadband communication systems, without the deficiencies typically found in the prior art.

Group delay compensation in the feedback path (as illustrated in FIG. 1) may be realized by using low-pass filters (e.g., demodulator low-pass filters 175, 180) with phantom zeros and their associated poles. The first zero is to sit near the zero-crossing frequency of the loop gain in order to increase the phase margin. The associated poles are designed to be far enough away from the zero not to affect the performance within the frequency band of interest. If one zero-pole pair of low-pass filters is not enough to bring the phase margin larger than desired, more zero-pole pairs may be introduced. This, however, may be limited by implementation when too many zero-pole pairs are used. As a result, by employing group delay compensation according to the principles described herein in a system in which it is typically impossible to use Cartesian feedback, not only is Cartesian feedback possible, but the group delay compensation of the present invention results in a phase margin even better than those typically seen in Cartesian feedback-capable transmitters. The loop gain, however, is hardly influenced within the desired bandwidth as long as the associated poles are kept far away from the zeros. An advantage of employing group delay compensation according to the invention in the feedback path is that the zeros in the low-pass filters are phantom, e.g., they do not influence the forward going signals. Therefore, the location of zeros may be freely chosen.

Group delay compensation in the forward, as briefly mentioned above, may be realized by using low-pass filters (e.g., loop filters 115, 120) before signal modulation. The implementation of the present invention in the forward path similarly may be accomplished using real zeros and their associated poles. In a beneficial embodiment, these zero-pole pairs are implemented together with the loop filters 115, 120. However, since the zeros in the forward path change the transfer function of the closed-loop, the location of these zeros must be carefully chosen. For most wireless applications, fortunately, oscillation or noise peaking occurs near the loop-gain zero-crossing frequency, which is normally far higher than the signal frequencies. So, the introduction of zeros in the forward path does not influence the performance of the in-band signal. The advantage of zeros in forward path is that it not only gives no influence on in-band signals, but also significantly suppresses the out-of-band noise peaking.

Figure 2:
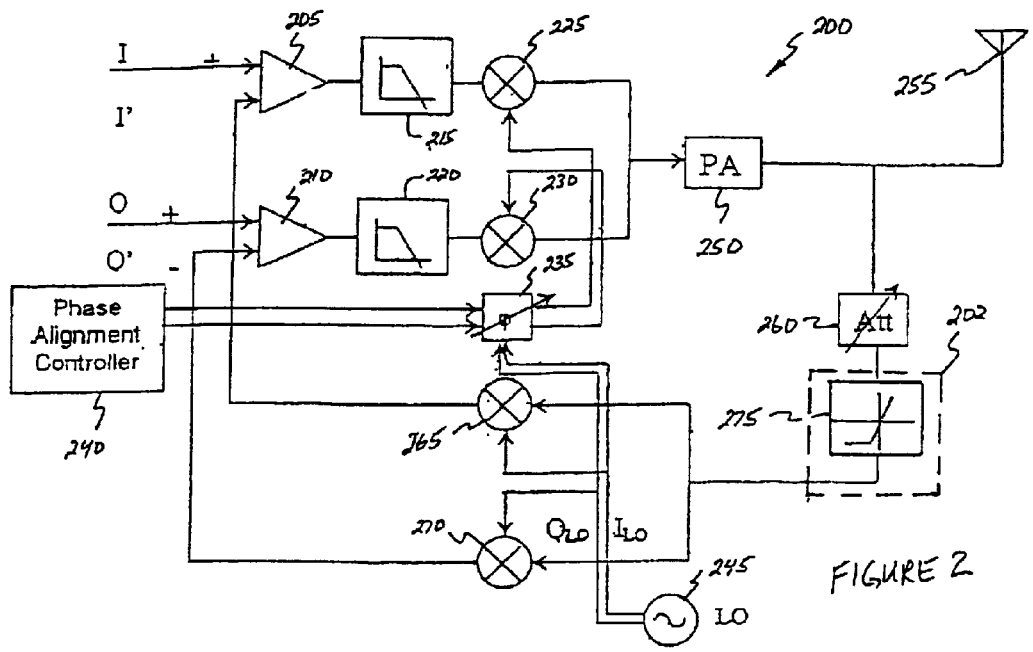
FIG. 2 illustrates an RF transmitter having an alternative embodiment of a group delay precompensator constructed according to the principles of the present invention.

Turning now to FIG. 2, illustrated is an RF transmitter 200 having an alternative embodiment of a group delay precompensator constructed according to the principles of the present invention. As with the transmitter 100 in FIG. 1, the transmitter 200 in this embodiment includes first and second error comparators 205, 210, first and second modulator loop filters 215, 220, and first and second modulating mixers 225, 230 for producing a precompensated modulated signal for transmission from the transmitter 200. The local oscillator signal used for signal modulation is generated and provided by a phase shifter 235, a phase alignment controller 240, and a local oscillator 245. As before, those who are skilled in the art understand the components employed to generate a local oscillator signal, so that discussion will not be presented here in any further detail.

The modulated signal is boosted with a power amplifier 250 and transmitted via an antenna 255. In addition, the output signal is also fed into an attenuator 260 as part of a Cartesian feedback loop. After the attenuator 260 removes the previously introduced gain from the signal, the remaining feedback signal is fed into a group delay compensation block 202 to compensate for any phase distortion introduced into the modulated output signal by the power amplifier 250. Prior to feeding the feedback signal into first and second demodulating mixers 265, 270, the feedback signal is first fed into the group delay compensation block 202, which in this embodiment of the present invention is comprised of a filter 275.

In the illustrated embodiment, the filter 275 is an RF filter and is located in the RF portion of the Cartesian feedback loop, e.g., before feedback signal demodulation. Moreover, in an advantageous embodiment, the RF filter 275 is coupled to, but after the attenuator 260. However, in alternative embodiments, the filter 275 may be employed in place of the attenuator 260. In such embodiments, the RF filter is preferably an RF band-stop filter and the attenuation value may need to be tuned to track the gain change of the power amplifier 250, the channel frequency, and the antenna load change. Tuning the group delay compensation block 202 in the RF portion of the feedback loop may be accomplished by using a resistor-capacitor bank in a variety of manners, which is discussed in greater detail below, with reference to FIGS. 4–8.

Additionally, as in the illustrated embodiment, the RF filter 275 has a positive phase versus frequency slope. Of course, other types of filters may be employed, and those who are skilled in the art will understand the benefits and detriments associated with employing a variety of filters into the Cartesian feedback loop. Regardless of whether the group delay compensation block 202 (in the illustrated embodiment, the RF filter 275) is employed with the attenuator 260 or in place of it, group delay precompensation in the RF portion of the Cartesian feedback loop provides benefits to broadband broadcasting commensurate to those discussed with respect to FIG. 1.

Figure 3:
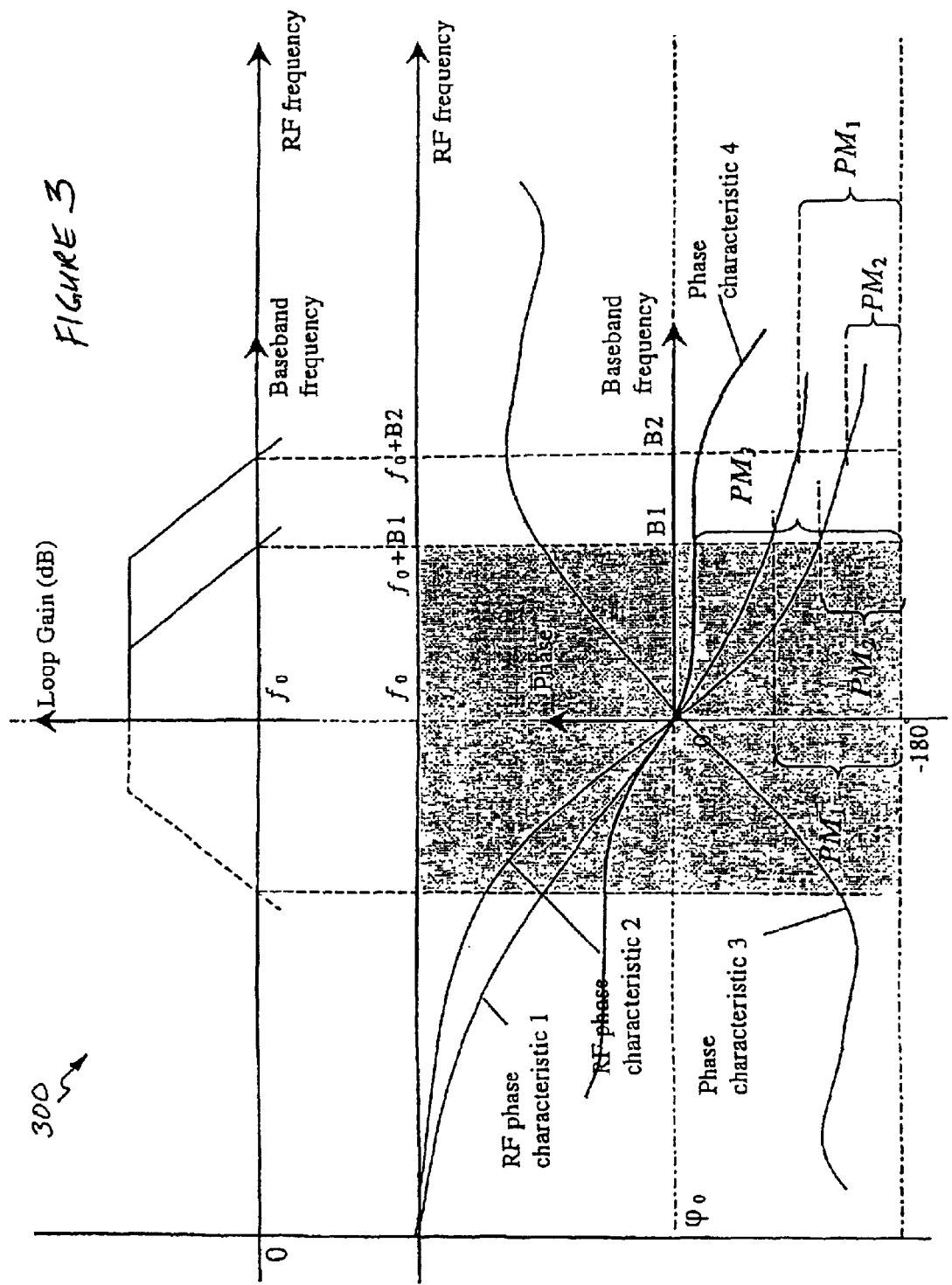
FIG. 3 illustrates a graphical representation of the influence of RF phase distortion, as well as phase precompensation according to the present invention on phase margins of baseband signals.

Turning to FIG. 3, illustrated is a graphical representation of the influence of RF phase distortion or RF group delay, as well as phase precompensation according to the invention disclosed herein on phase margins of baseband signals. FIG. 3 is provided to illustrate the changes in RF phase of a transmitted signal, with power amplifier phase distortion and tuning of group delay compensation block precompensation. To this end, parameters for understanding FIG. 3 are set forth first.

With reference to FIG. 3 and for a simplified understanding of the precompensation provided by the present invention, first assume that the signal at RF frequency with a bandwidth of B1 is directly converted to baseband. It must be understood that this assumption is for simplicity and clarity of discussion and that the present invention is not limited to only direct convert systems. Second, assumed that the fixed RF delay or phase $\Phi_o$ at frequency $f_o$ is compensated by the phase shifter. Looking at FIG. 3, those skilled in the art will understand that a power amplifier having RF phase characteristic 1 results in more phase margin than a power amplifier having RF phase characteristic 2. As a result, a power amplifier having RF phase characteristic 1 will be more stable. It is further assumed that a power amplifier in a transmitter produces an output signal having a phase characteristic 2. Additionally, as with the embodiments of the present invention described above, the output of the power amplifier is demodulated back to baseband feedback signals (e.g., I', Q') in a Cartesian feedback loop. Finally, in order to further simplify the explanation, further assume that any phase distortion introduced by the demodulator and other baseband blocks is neglected. Therefore, the same phase characteristic is present at baseband right after feedback signal demodulation. This point is illustrated at the intersection of the phase and baseband frequency axes shown in the lower middle part of FIG. 3.

With these parameters and assumptions in mind, attention is now turned to the impact of precompensation according to the present invention on the Cartesian feedback loop gain. The Cartesian feedback loop gain has a phase margin of PM2, which is not enough for the entire transmitter system to be stable. However, by employing a group delay compensation block according to the principles described herein, in either the baseband or RF portion of the Cartesian feedback loop, an opposing phase characteristic (phase characteristic 3) is introduced to provide the precompensation for the phase distortion or group delay introduced by the power amplifier. After the precompensation is introduced, the final phase curve of the loop gain is changed to phase characteristic 4, giving a phase margin of PM3. As is shown with the waveforms in FIG. 3, the phase margin of a Cartesian feedback loop gain may be significantly increased by employing group delay compensation according the present invention. In addition, as illustrated, the phase shift of the loop gain from a first bandwidth B1 to a second bandwidth B2 has less variation. As a result, phase distortion or group delay typically introduced with conventional power amplifiers, especially across larger bandwidths, may be continuously and dynamically compensated by a group delay precompensator of the present invention by implementing a Cartesian feedback loop into broadband transmission schemes. With such dynamic compensation, phase distortion or group delay across large bandwidth channels within broadband transmission spectrums is reduced or even eliminated.

Figure 4:
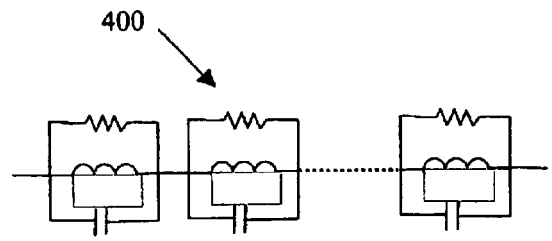
FIG. 4 illustrates the effects of implementing one embodiment of an RF band-stop filter in the RF portion of a Cartesian feedback loop in accordance with the principles of the present invention.

Referring now to FIG. 4, illustrated are the effects of implementing one embodiment of an RF band-stop filter 400 in the RF portion of a Cartesian feedback loop in accordance with the principles of the present invention. The band-stop filter 400 uses a series of LC tanks to achieve a phase similar to phase characteristic 3 illustrated in FIG. 3. The stop-band attenuation, however, is the value of the attenuator. This differs from the implementation of the present invention in the baseband portion, as discussed above, in that a band-stop filter employed with a circuit of the present invention should have wideband properties in order to cover the whole RF frequency band and the frequency deviation caused by process spread, temperature, etc. This is a disadvantage of implementing a conventional band-stop filter, such the filter 400 illustrated in FIG. 4, with a Cartesian feedback circuit according to the present invention. Conversely, an advantage to implementing the group delay compensator of the present invention in the RF portion is that no extra building blocks for group delay compensation are needed. More specifically, the attenuator (e.g., band-stop filter) itself is also the group delay compensator.

Figure 5:
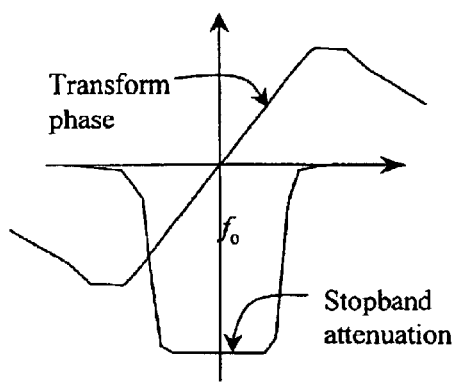
FIG. 5 illustrates RF channel tracking and attenuation tuning capabilities provided by a narrow bandwidth band-stop filter constructed according to the present invention.
Figure 6:
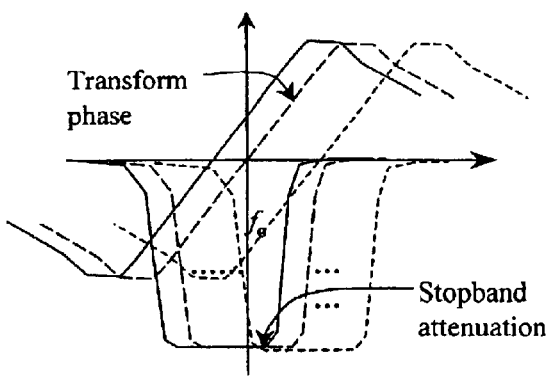
FIG. 6 illustrates a narrow bandwidth band-stop filter having a plurality of capacitors and resistors that may provide the desirable RF channel frequency tracking and attenuation tuning illustrated in FIG. 5.
Figure 6:
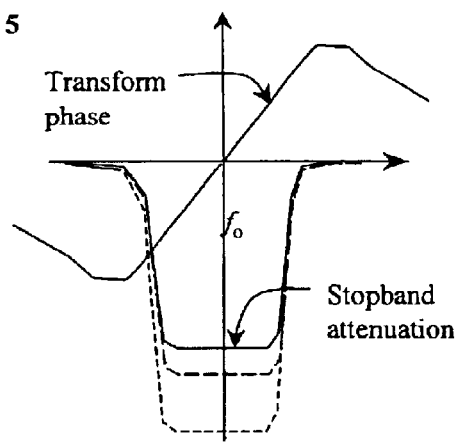
Figure 6:
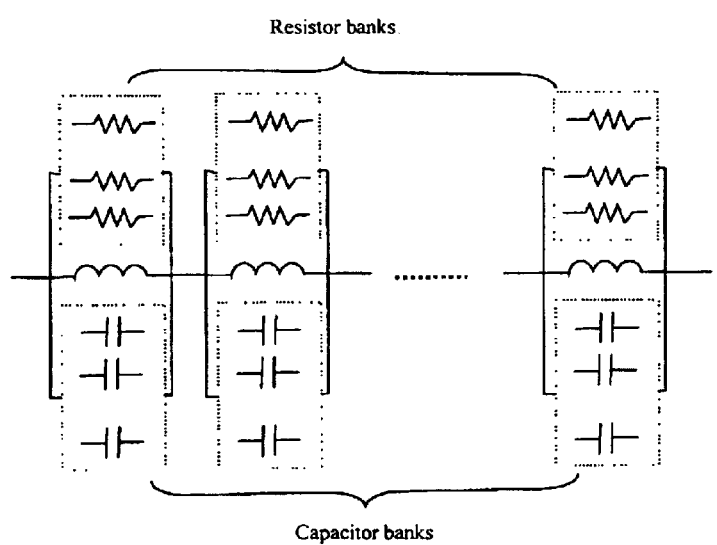

An improvement of this is to design a relatively narrow bandwidth band-stop filter and to track the RF center frequency of an RF group delay block of the present invention, as illustrated in FIG. 5. However, in order to take full advantage of the group delay compensation provided by the present invention, the bandwidth of such a filter must be still wide enough to cover the loop-gain zero-dB frequency (for enough phase margin) and 180°-phase frequency (for enough loop-gain margin). Thus, the tracking of RF center frequency (or channel frequency) by such a band-stop filter may be realized by switching a plurality of capacitors within the specially designed filter. After switching the capacitors from one to another, the quality factor of the tank may be changed. As a result, in an exemplary embodiment, switching of resistors also takes place in order to keep the same attenuation. FIG. 6 illustrates one embodiment of a narrow bandwidth band-stop filter 600 having a plurality of capacitors and resistors that may provide the desirable RF channel frequency tracking and attenuation tuning illustrated in FIG. 5.

In many applications, alternatively, the attenuation value may also be tuned to track the gain change of the power amplifier typically present in the circuit. When implementing the group delay compensation block in the RF portion of the Cartesian feedback loop, this may be accomplished by using the resistor bank illustrated in FIG. 6. In such an embodiment, the capacitor bank would be fixed and only the resistors would be switched for variable quality factors. The result is the tunable attenuation illustrated in FIG. 5. A disadvantage to this type of tuning in the band-stop filter is that the group delay compensation typically changes along with the attenuation, typically requiring further tuning of circuit components.

Referring to FIG. 7, illustrated in an alternative embodiment of a band-stop filter 700 for use in the RF portion of a Cartesian feedback loop according to the present invention. The filter 700 is a bridged-T network to provide a high-Q band-suppression filter. Those who are skilled in the art will understand that the basic structure of the filter 700 is similar to the filter structure illustrated in FIG. 6. For tuning, two capacitors C1, C2 and one resistor R may be provided in a switched component bank. In yet another alternative embodiment, a variation having continuously variable components may include varactors in place of the capacitors C1, C2 and a field effect transistor (FET) in place of the resistor R.

The function of the filter 700 in FIG. 7 differs slightly from those described above. More specifically, cancellation of an input signal at the output may be achieved if $R=R_{inf}$, as calculated using equation (2) below. Assuming that at output frequency $f_O$ the output signal is zero, this means at $f_O$ there is infinite attenuation. With $R>R_{inf}$, there is an imperfect notch filtering action with finite attenuation. The polar plot of output voltage over input voltage Uout/Uin is illustrated in FIG. 8 for the band-stop filter 700 illustrated in FIG. 7 (voltage source at input, open output assumed). In such an embodiment, the filter's 700 phase characteristic contains a frequency-region with increasing phase over frequency, as illustrated in FIG. 8, at the locus close to the point $f=f_O$. Both the attenuation and Q may be varied by varying R. Assuming the Quality Factor $Q_L$ of the inductor L is:

$$Q_L = R_p/w_o L, \qquad (1)$$

where $R_p$ is the parasitic resistance of the LC branch. Therefore, infinite attenuation is obtained at:

$$R_{inf} = w_O L Q_L/4 = w_O L (R_p/w_O L)/4 = R_p/4, \qquad (2)$$

where $w_O = 2\pi fo$. Choosing $R>R_{inf}$ leads to the desired response.

The useful properties remain when there are finite source and load impedances. In this implementation, parasitics in all components must be taken into account since they will change the necessary value of R to obtain the desirable phase response. In addition, the networks may also be cascaded if the circuit application should require.

Although the present invention has been described in detail, those skilled in the art should understand that they can make various changes, substitutions and alterations herein without departing from the spirit and scope of the invention in its broadest form.

What is claimed is:

1. For use in a radio frequency (RF) transmitter that employs a power amplifier to transmit broadband signals, said power amplifier introducing amplitude and phase distortion into said broadband signals, a group delay precompensator circuit, comprising:
   a Cartesian feedback loop coupled between an output of said power amplifier and an input of said RF transmitter; and
   a group delay compensation block, located in said Cartesian feedback loop, that introduces an opposing phase characteristic into said Cartesian feedback loop and thereby precompensates for said phase distortion.

2. The group delay precompensator circuit recited in claim 1 wherein said group delay compensation block is located within a baseband portion of said Cartesian feedback loop.

3. The group delay precompensator circuit recited in claim 2 wherein said group delay compensation block includes a plurality of low-pass filters configured to filter a demodulated feedback signal derived from said broadband signals.

4. The group delay precompensator circuit recited in claim 1 wherein said group delay compensation block is located within an RF portion of said Cartesian feedback loop.

5. The group delay precompensator circuit recited in claim 4 wherein said group delay compensation block includes a band-stop filter configured to filter a modulated feedback signal derived from said broadband signals.

6. The group delay precompensator circuit recited in claim 1 wherein said broadband signals represent a wideband of RF signals.

7. The group delay precompensator circuit recited in claim 6 wherein said wideband of RF signals is in the 5 GHZ frequency range.

8. For use in a radio frequency (RF) transmitter employing a power amplifier for transmitting broadband signals, said power amplifier introducing amplitude and phase distortion into said broadband signals, a method of precompensating a group delay, comprising:
   coupling a Cartesian feedback loop between an output of said power amplifier and an input of said RF transmitter; and
   introducing an opposing phase characteristic into said Cartesian feedback loop with a group delay compensation block, located in said Cartesian feedback loop, and thereby precompensating for said phase distortion.

9. The method recited in claim 8 wherein said group delay compensation block is located within a baseband portion of said Cartesian feedback loop.

10. The method recited in claim 9 wherein said group delay compensation block includes a plurality of low-pass filters configured to filter a demodulated feedback signal derived from said broadband signals.

11. The method recited in claim 8 wherein said group delay compensation block is located within an RF portion of said Cartesian feedback loop.

12. The method recited in claim 11 wherein said group delay compensation block includes a band-stop filter configured to filter a modulated feedback signal derived from said broadband signals.

13. The method recited in claim 8 wherein said broadband signals represent a wideband of RF signals.

14. The method recited in claim 13 wherein said wideband of RF signals is in the 5 GHZ frequency range.

15. A radio frequency (RF) transmitter, comprising:
   an antenna;
   a power amplifier configured to transmit broadband signals through said antenna, said power amplifier introducing amplitude and phase distortion into said broadband signals; and
   a group delay precompensator circuit, comprising:
      a Cartesian feedback loop coupled between an output of said power amplifier and an input of said RF transmitter, and
      a group delay compensation block, located in said Cartesian feedback loop, that introduces an opposing phase characteristic into said Cartesian feedback loop and thereby precompensates for said phase distortion.

16. The RF transmitter recited in claim 15 wherein said group delay compensation block is located within a baseband portion of said Cartesian feedback loop.

17. The RF transmitter recited in claim 16 wherein said group delay compensation block includes a plurality of low-pass filters configured to filter a demodulated feedback signal derived from said broadband signals.

18. The RF transmitter recited in claim 15 wherein said group delay compensation block is located within an RF portion of said Cartesian feedback loop.

19. The RF transmitter recited in claim 18 wherein said group delay compensation block includes a band-stop filter configured to filter a modulated feedback signal derived from said broadband signals.

20. The RF transmitter recited in claim 15 wherein said broadband signals represent a wideband of RF signals.

* * * * *